United States Patent [19]

Hines et al.

[11] 4,050,762
[45] Sept. 27, 1977

[54] TELESCOPING SPRING PROBE HAVING SEPARATE WIPER CONTACT MEMBER

[75] Inventors: Clyde Kenneth Hines, Arcadia; Everett James Long, Claremont; Lawrence Eugene Wysocki, Covina, all of Calif.

[73] Assignee: Everett/Charles, Inc., Pomona, Calif.

[21] Appl. No.: 740,396

[22] Filed: Nov. 10, 1976

[51] Int. Cl.² .......................................... H01R 13/00
[52] U.S. Cl. .............................. 339/108 TP; 200/46; 324/72.5
[58] Field of Search ................ 339/108 TP; 324/72.5, 324/51, 149; 200/46, 61.53, 163, 277

[56] References Cited

U.S. PATENT DOCUMENTS

| | | | |
|---|---|---|---|
| 1,651,314 | 11/1927 | Beasley, Jr. | 200/277 |
| 1,831,372 | 11/1931 | Spangler | 324/72.5 |
| 2,515,004 | 7/1950 | Haupt | 339/108 TP X |
| 2,773,964 | 12/1956 | Majkrzak | 200/163 X |
| 2,885,648 | 5/1959 | King | 339/108 TP X |
| 3,315,163 | 4/1967 | Lutz | 324/149 |
| 3,412,327 | 11/1968 | Murray | 324/72.5 |
| 3,435,168 | 3/1969 | Cooney | 200/46 X |
| 3,562,643 | 2/1971 | Smith | 324/72.5 |
| 3,753,103 | 8/1973 | Tetreault et al. | 339/108 TP X |
| 3,812,312 | 5/1974 | Anderson et al. | 200/61.53 |

OTHER PUBLICATIONS

Everett/Charles, Inc. SPA-O "Snap-out" Spring Probe Nov. 1, 1974.

Primary Examiner—Roy Lake
Assistant Examiner—DeWalden W. Jones
Attorney, Agent, or Firm—Christie, Parker & Hale

[57] ABSTRACT

A miniature low resistance telescoping spring probe includes telescoping tubular housing and inner plunger. Both the housing and plunger are elongated and of an electrically conductive material. The plunger has a probe head external to the housing. The inner wall of the housing and the outer wall of the plunger are engaged and concentric, providing a sliding electrical connection and a bearing therebetween. A coil compression spring urges the housing and plunger in longitudinally opposite directions. A separate low electrical resistance wiper spring member is affixed to the plunger. A substantially constant low resistance electrical connection is provided between the wiper spring member and the plunger. The wiper spring member has at least one longitudinally extending leg spring loaded outwardly into engagement with the inside wall of the housing. A bearing surface on the leg in engagement with the inside wall provides a substantially constant low resistance electrical connection between the wiper spring member and the inside wall during telescoping movement.

21 Claims, 14 Drawing Figures

TELESCOPING SPRING PROBE HAVING SEPARATE WIPER CONTACT MEMBER

BACKGROUND OF THE INVENTION

This invention relates to miniature telescoping spring loaded electrical probes (hereinafter telescoping spring probes) for establishing low resistance electrical test connections with conductors on, for example, printed circuit boards.

Telescoping spring probes are generally known for making electrical test connections with conductors on printed circuit boards. They are generally affixed in a jig employed in a circuit tester and continuity or lack of continuity between various electrical nodes on a printed circuit board are detected through the probes.

One type of prior art telescoping spring probe manufactured by the assignee of the present invention has an elongated conductive tubular housing with an interior wall. An elongated electrically conductive plunger telescopes with respect to the housing, being slidably mounted on the interior wall of the housing. The plunger has a conical shaped end at the interior of the housing and a coil compression spring engages the conical shaped end, normally urging the plunger and housing in opposite directions to a fully extended stop. The housing is inserted in a conductive receptacle making electrical contact therewith. An electrical connection is made to the receptacle such as by wire wrap or other conventional means, and a probe on an exposed end of the plunger makes electrical contact with the node of the circuit to be tested.

Modern circuit testers generally require telescoping spring probes for making electrical contact through each probe to a different one of a number of very closely spaced nodes. Typically, it is necessary to make electrical contact with, for example, hundreds of nodes, any one of which may be spaced as closely as 0.100 inch on center. As a result a need has arisen for spring probes with an outside housing (O.D.) diameter in the order of 0.04 to 0.150 inch and an inside housing diameter in the order of 0.025 to 0.110 inch.

In addition it is extremely important that consistent low electrical resistance be maintained between the plunger and the housing. It has now become necessary to ensure such low level electrical resistance, in the order of 10 to 25 milliohms, over hundreds of thousands of telescoping cycles. Such consistent low electrical resistance is required during the entire extent of travel of each individual telescoping cycle of the probe and housing as well as from one cycle to another.

Additionally, many of such very small sized, constantly low electrical resistance telescoping spring probes are required in any one test apparatus which necessitates that the cost of each probe be minimized.

Electrical connection is made between the plunger and housing, in the aforementioned prior art probe, through the coil compression spring as well as between the sliding surfaces of the plunger and the housing. It has been found that the electrical resistance between the plunger and housing varies with prolonged cycling, due to wear of the parts, wear particle buildup between parts, movement between parts, and changes in pressure of the coil compression spring during a telescoping cycle.

Summarizing, there is a need for a telescoping spring probe requiring the combination of miniature size of 0.04 to 0.150 O.D.; consistency of low level electrical resistance between parts in the milliohm range within each telescoping cycle and from cycle to cycle over a high number of telescoping cycles in the order of hundreds of thousands of cycles; and very low cost of manufacture.

Attempts have been made to reduce the electrical resistance between the plunger and housing of telescoping spring probes. In one prior device a telescoping spring loaded probe, of the general type discussed above, is provided. However, one or more small metal balls are positioned between the coil compression spring and the end of the plunger. In one arrangement the end of the plunger is inclined and engages a single ball. In another engagement the end of the plunger is conical shaped with a small ball engaging the inclined conical end of the plunger; and a larger ball is positioned between the small ball and the compression spring. The coil compression spring, in both embodiments, forces a ball tightly against the inside wall of the housing and the ball (or balls) forces the plunger transversely into tight sliding electrical contact with the inside wall of the housing. There are a number of disadvantages with such arrangement, including: excessive wear due to high transverse forces between the inside wall of the housing and the plunger, resulting in low cycle life; wear particles lodge between the plunger and the housing thereby causing varying electrical resistance between the plunger and housing; the contact pressures between the ball, plunger and housing vary over the telescoping cycle due to changes in pressure of the coil spring, causing varying electrical resistance between the housing and plunger; and gold is apparently required on the inside housing wall, increasing costs.

SUMMARY OF THE INVENTION

The present invention represents a significant advance in the telescoping spring probe art.

Specifically, prior art telescoping spring probes generally establish electrical connection between plunger and housing through the interface between plunger and housing and through the coil compression spring. By way of contrast, the inventors of the present invention, recognizing the problem of relying on such electrical connections, have now provided a separate wiper spring member for producing a very low resistance electrical connection between the electrically connected plunger and housing. With this arrangement it is now possible to precisely control the electrical resistance between the housing and plunger to a substantially constant and very low level.

An embodiment of the present invention is a miniature low resistance spring probe. Included are telescoping tubular housing and inner plunger both being elongated and of an electrically conductive material. The plunger has a probe head external to the housing. Engagement between the concentric inner wall on the housing and outer wall on the plunger provide a sliding electrical connection and a bearing therebetween. A coil compression spring urges the housing and plunger in longitudinally opposite directions. Significantly a separate low electrical resistance wiper spring member is affixed to the plunger. A substantially constant low resistance electrical connection is established between the wiper spring member and the plunger. The wiper spring member comprises at least one longitudinally extending leg which is spring loaded outwardly into engagement with the inside wall. A bearing surface on the leg is in engagement with the inside wall and thereby provides a substantially constant low resistance electrical connection between the wiper spring member and the inside wall during telescoping movement.

Thus applicants, instead of enhancing the electrical connection between the telescoping and sliding plunger and housing, have provided a separate wiper spring member whose spring temper and electrical characteristics are carefully controlled, and connect the separate wiper spring member to the plunger so that it forms a sliding contact with the inside wall of the housing. As a result there is a low electrical resistance through the housing and plunger of 25 milliohms or less. Significantly, the separate wiper spring member can be spring tempered separately from the processing of the plunger in order to precisely control the amount of spring load against the inside wall of the housing to thereby minimize wear and yet maintain the desired low level of resistance at the electrical contact. Additionally it is now possible to construct a spring probe of the aforementioned type with an outer diameter of 0.150 inch or less.

Preferably the ratio of plunger travel relative to the outer housing diameter during a telescoping cycle is at least 2/1 even with the small housing outside diameter. This is important since the low electrical resistance is maintained throughout the travel between housing and plunger.

Applicants also disclose a preferred inventive embodiment of a spring probe which in itself is novel and unobvious over even the aforementioned embodiment. In this regard the low resistance electrical connection between the wiper spring member and plunger is formed by a stud which is formed from the plunger and is longitudinally extending away from an end of the plunger inside of the housing. The wiper spring member comprises an end having an opening therein through which the stud extends and forms an interference connection thereby providing the low resistance electrical connection between the plunger and wiper spring member and prevents relative transverse movement therebetween. The wiper spring member has its leg extending from the end thereof, and the coil compression spring acts between the housing and the inside end of the plunger through the end of the wiper spring member thereby capturing and securing the end of the wiper spring member in engagement with the plunger.

According to a still preferred embodiment, a press fit is formed between the stud and wiper spring member. According to an even still further preferred embodiment, the stud is tapered to facilitate the formation of the press fit. Such arrangements provide a very low cost and rigid construction for the miniature low resistance telescoping spring probe which is easy to assemble.

Also disclosed herein is a still even further preferred miniature low resistance telescoping spring probe which is also novel and unobvious over the aforementioned embodiment. Included are telescoping housing and inner plunger, and a separate wiper spring member of the general type described above. Significantly the separate low electrical resistance wiper spring member is affixed to the plunger and a substantially constant low resistance electrical connection is established between the wiper spring member and plunger. The wiper spring member comprises an elongated leg extending longitudinally along the plunger and significantly comprises a bearing portion spring loaded by the leg into low electrical resistance contact with the inside wall of the housing. Significantly the leg has inwardly extending portions on each side of the bearing portion which engage the plunger and thereby stabilize the leg. Such an arrangement is quite significant in a miniature telescoping spring loaded probe in that the leg of the wiper spring member is stabilized even over hundreds of thousands of cycles of operation, increasing wear life.

Preferably, the wiper spring is formed of a flat stamped spring material and is formed or drawn into the desired shape. With this construction substantial strength is added to the support for the leg, enhancing spring life.

An even further preferred embodiment of the present invention utilizes a wiper spring member which has a cup-shaped end from which the leg extends.

DRAWINGS

FIG. 6 is an even further enlarged view of the wiper spring member and a portion of the adjacent end of the plunger taken from the probe of FIG. 5; FIG. 6 illustrates the interference press fit between the separate wiper spring member and the stud on the plunger;

DETAILED DESCRIPTION

Figure 1:
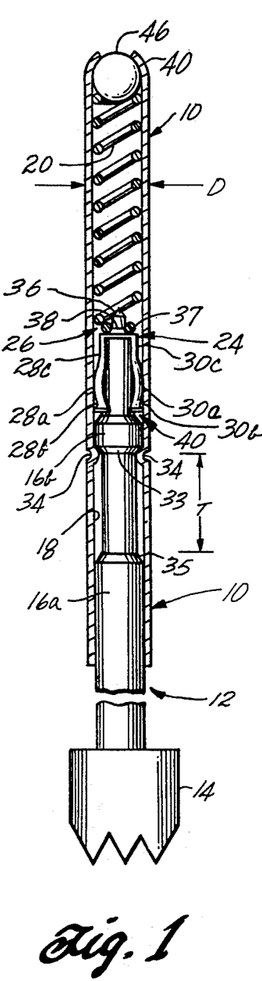
FIG. 1 is an enlarged side view of a low resistance telescoping spring probe and embodies the present invention; portions of the housing and coil compression spring are broken away for clarity.
Figures 1A, 3:
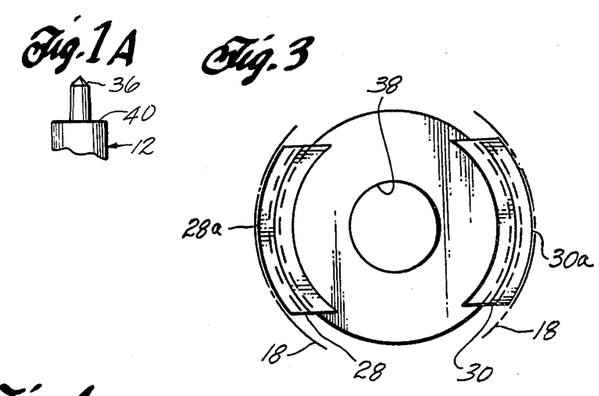
FIG. 1A is an even greater enlarged view of the inside end of the plunger of FIG. 1.
FIG. 3 is an end view of the separate wiper spring member as seen from the lower side of FIG. 2.
Figure 2:
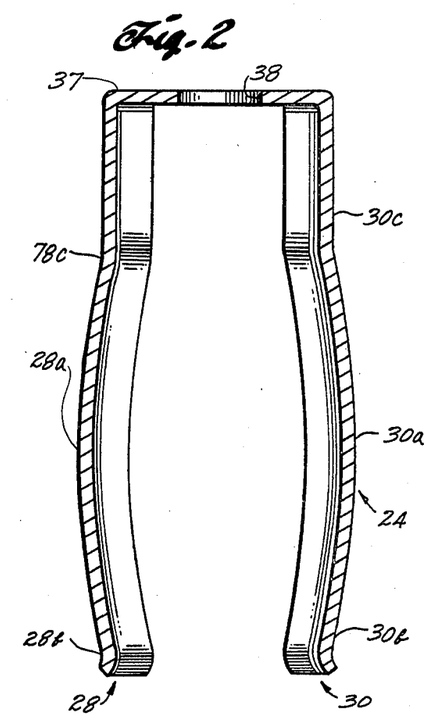
FIG. 2 is an even greater enlarged longitudinal cross-sectional view of the separate wiper spring member of FIG. 1.

Refer now to the preferred embodiment of the invention depicted in FIGS. 1-3. A miniature low resistance telescoping spring probe is disclosed. Included is a telescoping tubular housing 10 and inner plunger 12. Both the housing and plunger are generally round in cross-section, concentric, elongated and are formed of an electrically conductive material. The plunger 12 has a probe head 14 for making electrical test connections to nodes on, for example, a printed circuit board. An inner wall 18 on the housing 10 and outer walls 16a and 16b on the plunger provide a sliding electrical connection and a bearing between the telescoping parts.

A coil compression spring 20 urges the housing and plunger in longitudinally opposite directions.

Significantly, a separate low electrical resistance wiper spring member 24 is affixed to the plunger 12. To be explained in more detail, a substantially constant low resistance electrical connection is provided at 26 between the wiper spring member and plunger.

The wiper spring member 24 has at least one longitudinally extending leg, spring loaded outwardly into engagement with the inside wall 18 of housing 10. Although the invention is not limited thereto, two legs 28 and 30 are preferably contained in the wiper spring member. Each of the legs 28 and 30 has a bearing surface 28a and 30a, respectively, which are in sliding engagement with the inside wall 18 and thereby provides a substantially constant low resistance electrical connection between the wiper spring member and the inside wall of the housing during telescoping movement.

Preferably the plunger and housing are formed of a relatively high conductive metal such as copper alloys or some grades of steel. However, the importance of the conductivity is minimized by the use of the separate wiper spring member. Preferably the coil compression spring 20 is formed of beryllium copper or stainless steel and also makes electrical connection between the plunger and housing although the electrical connection provided by the coil compression spring is of no significance in establishing the low electrical resistance between the plunger and housing of the present invention.

The plunger 12 has a recessed portion forming abutments at 33 and 35 and the housing 10 is inwardly formed at 34 thereby forming stops for the outward and inward movements of the plunger relative to the housing. The travel "T" permitted by the stops is preferably at least twice that of the outside diameter "D" of the housing. In the disclosed embodiment, D is approximately 0.054 inch and T is approximately 0.250 inch. One embodiment of the invention has an outer housing diameter of 0.054 inch, an inner housing diameter of 0.042 inch, and an outer plunger diameter of 0.040 inch. Hence the separate wiper spring member and the coil compression spring all must be constructed and positioned within the very small diameter of approximately 0.042 inch.

The construction establishing the low resistance electrical connection at 26 is significant to the preferred embodiment of the invention. Preferably a stud 36 is formed from the inside end of and as an integral part of the plunger 12. The stud 36 is conical or inwardly tapering as it extends longitudinally away from the plunger. The wiper spring member 24 has an end 37 with an opening 38 through which the stud extends and forms an interference connection. FIGS. 2 and 3 depict the wiper spring member 24 before it has been positioned over the end of the stud 36. Significantly, the opening 38 is smaller than the lower portion of the stud 36 and the wiper spring member is press fitted and thereby swaged over the stud causing a flare around the stud 36 as depicted at 26. With such construction a low resistance electrical connection is ensured between the wiper spring member and the plunger. Also the wiper spring member is mechanically stabilized on the end of the plunger.

Preferably the plunger 12 has an annular end surface 40 (see FIG. 1A) surrounding the stud 36 which is substantially longitudinally facing within the probe. As the end 37 of the wiper spring member is press fitted into place over the stud, the end 37 is forced into engagement with the annular end surface 40, thereby providing further mechanical stability to the wiper spring member.

Preferably the outer perimeter of the end 37 of the wiper spring member 24 is smaller than the diameter of the inside wall 18 and hence does not interfere therewith during telescoping movement.

One end of the coil compression spring 20 engages the end 37 of the wiper spring member 24 and as a result, further ensures that the wiper spring member 24 remains captured and maintained in low resistance electrical contact with the end of the plunger 12. Although not essential to the present invention, the end of the coil spring 20 opposite from the wiper spring member 24 is secured by an inwardly formed end portion 40 of the housing 10 and a ball 46. It should be understood that the ball may be removed and the end of the coil compression spring may rest against the inwardly formed end of the housing.

Preferably the bearing surfaces 28a and 30a of the legs 28 and 30, respectively, have the same radius and hence are contoured to match the shape of the transverse cross-section of the inside wall 18 as schematically depicted by the dashed lines in FIG. 3. With this arrangement the surface area of contact between the inside wall 18 and each of the bearing surfaces 28a and 30a is maximized, thereby substantially reducing the electrical resistance therebetween.

Figure 4:
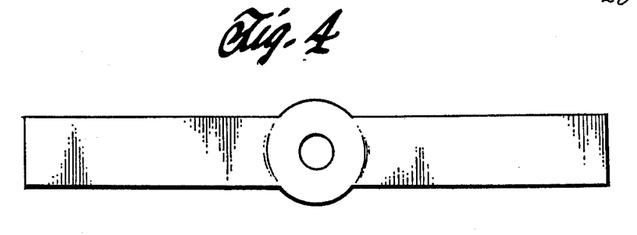
FIG. 4 is a sketch illustrating the preform of the separate wiper spring member after it has been stamped but before it has been formed into shape.

The wiper spring member 24 is preferably stamped from a flat thin walled low resistance metal such as beryllium copper, creating the preform depicted in FIG. 4. The preform is then shaped as depicted in FIGS. 2–3 before it is tempered and press fitted over the stud 36. It should be understood however that the wiper spring member may be fabricated from tubing. With such an arrangement it is now possible to separately temper the wiper spring member and thereby precisely control its resiliency. As a result the contact pressure and electrical resistance between the legs and the inside wall can be precisely controlled.

Figure 5:
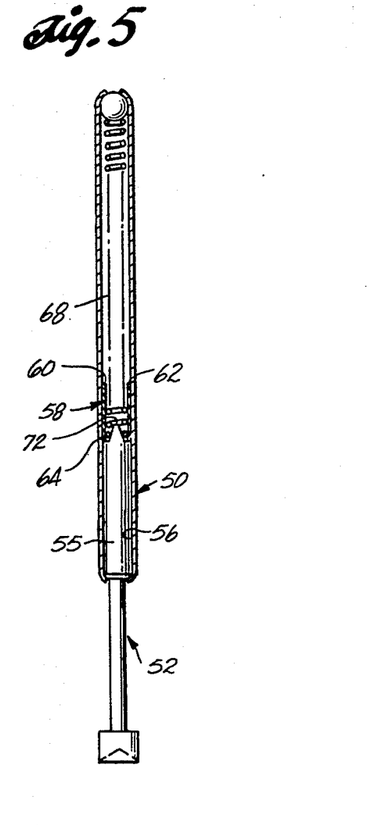
FIG. 5 is an enlarged side view of an alternate low resistance telescoping spring probe and embodies the present invention; portions of the housing, the coil spring and the wiper spring member are broken away for clarity.
Figure 6:
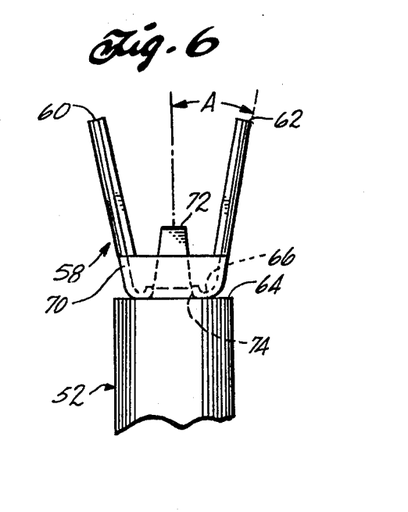
Figure 7:
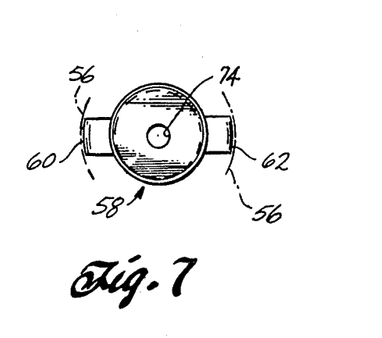
FIG. 7 is a bottom elevation view of the separate wiper spring member of FIG. 6.

Refer now to the alternate embodiment of the invention depicted in FIGS. 5–7. Telescoping tubular housing 50 and inner plunger 52 both are generally round in cross-section, concentric, elongated, and are formed of an electrically conductive material similar to the probe of FIG. 1.

However, in contrast to the probe of FIG. 1, the probe of FIGS. 5–7 has a single outer wall 55 making sliding and electrical contact with the inside wall 56 of the housing 50.

Similar to the probe of FIG. 1, the probe of FIGS. 5–7 has a wiper spring member 58 with legs 60 and 62. By way of contrast, the legs extend in a longitudinal direction away from the inside end 64 of the plunger 52. With this arrangement the coil compression spring 68 extends between the legs 60 and 62, engaging an end portion 66 of the wiper spring member. With this arrangement the coil compression spring 68 must be made small enough in diameter that it will pass between and does not interfere with the legs 60 and 62 of the wiper spring member 58. It is for this reason that the embodiment of the invention depicted in FIG. 1 is preferred.

Referring to FIG. 6, the wiper spring member 58 has a cup-shaped end portion 70 and the legs 60 and 62 extend from the edge of the cup-shaped end portion 70, increasing the rigidity and strength for support of the legs. Similar to the probe of FIG. 1, the probe of FIGS. 5–7 has a tapered stud 72 formed as an integral part of and extending from the inside end 64 of the plunger 52. An opening 74 in the end of the wiper spring member 58 is smaller than the lower part of tapered stud 72 and is press fitted in place over the stud 72, causing the end of the wiper spring member 58 to flare upwardly as depicted by dotted line at 74 in FIG. 6. Also similar to the probe of FIG. 1, the wiper spring member 58 has the outer surface of the legs 60 and 62 formed with a radius substantially equal to that of the inside wall 56 of the housing 50, to thereby maximize the surface area of electrical contact therebetween.

Figure 8:
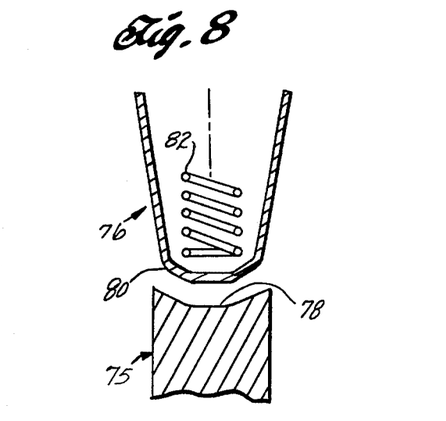
FIG. 8 is an exploded section view of an alternate wiper spring member, a portion of the end of an alternate plunger and a portion of the coil compression spring for use in the probe of FIG. 5.

FIG. 8 illustrates an alternate construction of a plunger and wiper spring member for use in the probe of FIG. 5. Specifically, a generally U-shaped wiper spring member 76 is depicted in section with a concave end 78 provided in the plunger 75. The wiper spring member 76 has a convex end portion 80 which extends into and engages the concave end portion 78 of the plunger. The electrical and mechanical connection between the wiper spring member 76 and the plunger 75 may be enhanced by a conductive bonding such as epoxy or cement or solder or a weld. Similar to the wiper spring member of FIG. 5, a coil compression spring 82 extends between the legs of the wiper spring member 76 and engages the end of the wiper spring member 75.

Figure 9:
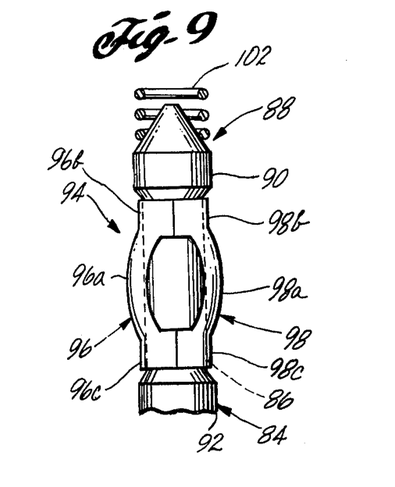
FIG. 9 is an enlarged side view of a portion of the inside end of a plunger, a separate wiper spring member and a cross-sectional view of a coil compression spring for an alternate embodiment of the present invention.

FIG. 9 depicts an alternate plunger and wiper spring member for use in the probes of the type depicted in FIGS. 1 and 5. In this embodiment a generally cylindrical shaped plunger 84 is depicted with an annular recessed portion 86 displaced from the inside end 88 of the plunger. Outer bearing surfaces 90 and 92 are positioned on opposite sides of the recess and thereby make mechanical and electrical sliding contact with the inside wall of the housing (not shown).

Within the annular recess 86 there is positioned a wiper spring member 94. The wiper spring member 94 is formed from a flat preformed material and is then formed around the recessed area 86 similar to that described with reference to FIG. 4. The wiper spring member 94 has legs 96 and 98 with rounded bearing surfaces 96a and 98a, respectively. The rounded bearing surfaces 96a and 98a are formed so that they have the same radius as the inside wall of the housing against which they engage and slide, thereby maximizing the electrical connection therewith. The portion of the legs containing the bearing surfaces 98a and 98a is spring loaded outwardly against the inside wall of the housing. On either side of the bearing surfaces 96a and 98a are inwardly extending leg portions 96b–96c and 98b–98c, respectively. The inwardly extending leg portions 96b–96c and 98b–98c engage the recessed portion 86 of the plunger, thereby providing a very low resistance electrical connection to the plunger and structurally stabilizing the position of the legs with respect to the plunger. The inwardly extending leg portions may be affixed by welding, solder, an electrically conductive epoxy, or other means to the plunger. A coil compression spring 102 engages the end 88 of the plunger, forcing the plunger to its fully extended position, similar to that described with reference to FIGS. 1 and 5.

Figure 10:
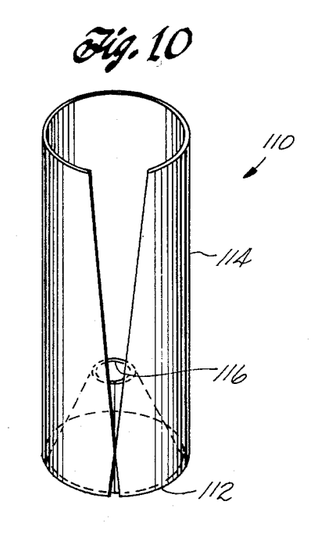
FIG. 10 is a diagrammatic view of an alternate wiper spring member for use in the probe of FIG. 5.
Figure 11:
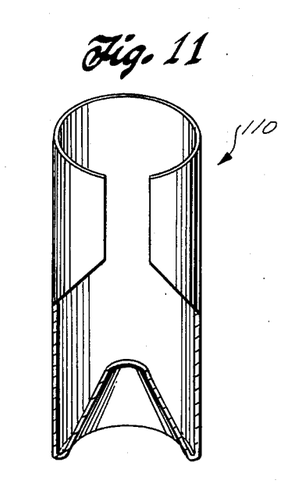
FIG. 11 shows the wiper spring member of FIG. 10 with a portion broken away.

FIGS. 10 and 11 depict an alternate wiper spring member 110 for use in the probe of FIG. 5. The wiper spring member is formed of an electrically conductive metal spring material and has an end 112 and a single leg 114 extending from the end. The wiper spring member is preferably formed from a split tube whose outside diameter is slightly smaller than the inside diameter of the housing in which it is positioned. The end 112 has an inward or reverse roll forming an opening 116 through the center of which the stud of FIG. 5 extends. The diameter of the opening 116 is small enough that it forms an interference fit with the stud, thereby minimizing the resistance between the wiper spring member and plunger. The leg 114 is split lengthwise and the wall of the leg is bent outwardly so as to preload the leg against the inside wall of the housing. The wiper spring member 110 has a single leaf forming the reverse roll. The end of the coil compression spring (not shown) fits into the cup formed by the reverse roll.

Figure 12:
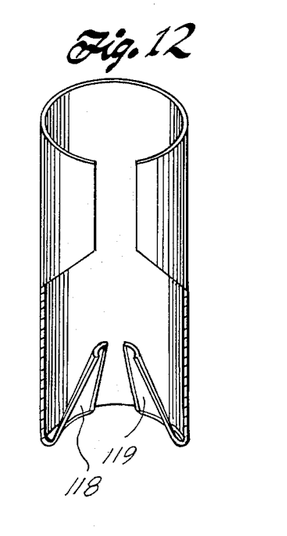
FIG. 12 is a view, similar to that of FIG. 11, showing another alternate wiper spring member for use in the probe of FIG. 5.
Figure 13:
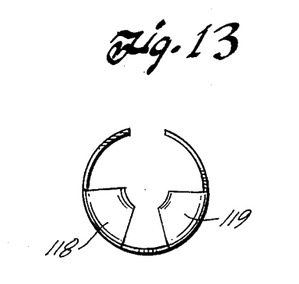
FIG. 13 is a bottom view of the wiper spring member of FIG. 12 with a portion broken away.

The wiper spring member of FIGS. 12 and 13 is essentially the same as that of FIGS. 10 and 11 except that it has two leaves 118 and 119 in the reverse roll. It will be understood that the reverse roll may have one, two or more leaves within the scope of the invention herein.

Although exemplary embodiments of the invention have been disclosed for purposes of illustration, it will be understood that various changes, modifications and substitutions may be incorporated into such embodiments without departing from the spirit of the invention as defined by the claims appearing hereinafter.

What is claimed:

1. A miniature low resistance telescoping spring probe comprising:
    telescoping tubular housing and inner plunger both being elongated and of an electrically conductive material;
    said plunger comprising a probe head, external to said housing;
    engaged and concentric inner wall on said housing and outer wall of said plunger providing a sliding electrical connection and a bearing therebetween;
    a coil compression spring urging said housing and plunger in longitudinally opposite directions;
    a separate low electrical resistance wiper spring member affixed to said plunger;
    a substantially constant low electrical resistance connection between said wiper spring member and plunger;
    said wiper spring member comprising at least one longitudinally extending leg spring loaded outwardly into engagement with said inside wall; and
    a bearing surface on said leg in engagement with said inside wall and thereby providing a substantially constant low electrical resistance connection between said wiper spring member and inside wall during telescoping movement.

2. A miniature probe according to claim 1 wherein said housing has an outside diameter of less than 0.150 inch.

3. A miniature probe according to claim 1 wherein said low electrical resistance connection between said wiper spring member and plunger comprises a stud, formed from said plunger, which is longitudinally extending and inwardly tapering away from an end of said plunger inside of said housing, and wherein said wiper spring member comprises an end having an opening therein through which said stud extends and forms an interference connection.

4. A miniature probe according to claim 1 wherein said wiper spring member and stud form a press fit.

5. A miniature low resistance telescoping spring probe comprising:
    telescoping tubular housing and inner plunger both being elongated and of an electrically conductive material, said plunger comprising a probe head external to said housing;
    engaged and concentric inner wall on said housing and outer wall on said plunger providing a sliding electrical connection and a bearing therebetween;
    a coil compression spring urging said housing and plunger in longitudinally opposite directions; and
    means for establishing a substantially constant low electrical resistance connection between said housing and plunger during the entire telescoping cycle thereof, comprising
        a separate low electrical resistance wiper spring member affixed to said plunger,
        a substantially constant low electrical resistance connection between said wiper spring member and plunger,
        said wiper spring member comprising at least one longitudinally extending leg spring loaded outwardly into engagement with said inside wall, and
        a bearing surface on said leg in engagement with and contoured to match the shape of the transverse cross-section of said inside wall and thereby providing a substantially constant low electrical resistance connection between said wiper spring member and inside wall during telescoping movement.

6. A miniature probe according to claim 5 wherein said housing has an outside diameter of less than 0.150 inch.

7. A miniature probe according to claim 5 wherein said low electrical resistance connection between said wiper spring member and plunger comprises a stud formed from said plunger, which is longitudinally extending and inwardly tapering away from an end of said plunger inside of said housing, and wherein said wiper spring member comprises an end having an opening therein through which said stud extends and forms an interference connection.

8. A miniature probe according to claim 7 wherein said wiper spring member and tapered stud are press fitted together.

9. A miniature probe according to claim 8 wherein said coil compression spring acts against such inside end of said plunger through said end of said wiper spring member.

10. A miniature probe according to claim 9 wherein such inside end of said probe comprises an annular end surface surrounding an end of said stud which is substantially longitudinally facing, the end of said wiper spring member being press fitted over said stud into engagement with said annular end surface.

11. A miniature probe according to claim 10 wherein the outer perimeter of the end of said wiper spring member is smaller than the outer perimeter of said plunger.

12. A miniature probe according to claim 5 wherein the end of said wiper spring member is cup shaped and said leg extends from an edge thereof.

13. A miniature probe according to claim 5 wherein said plunger comprises a recessed portion inside of said housing, said leg of said wiper spring member extending longitudinally adjacent said recessed portion and comprising at least one end portion inwardly positioned on one side of the bearing surface of said leg which bears against the recessed portion of the plunger and thereby mechanically stabilizes said leg.

14. A miniature low resistance spring probe comprising:
    telescoping tubular housing and inner plunger both being elongated and of an electrically conductive material;
    said plunger comprising a probe head external to said housing;
    engaged and concentric inner walll on said housing and outer wall on said plunger providing a sliding electrical connection and a bearing therebetween;
    means for establishing a substantially constant low resistance electrical connection between said housing and probe during the entire telescoping cycle thereof comprising
        a stud, formed from said plunger, which is longitudinally extending away from an end of said plunger inside of said housing,
        a separate wiper spring member having an end with an opening therein which forms an interference fit with said stud to thereby provide a low resistance electrical connection and prevent relative transverse movement between said plunger and wiper spring member, and
        said wiper spring member comprising a leg extending longitudinally from the end thereof and spring loaded outwardly into engagement with said inside wall to thereby provide low resistance electrical contact with the inside wall throughout the telescoping cycle; and
    a coil compression spring acting between the housing and the inside end of said plunger through the end of said wiper spring member urging said housing and plunger in longitudinally opposite directions and capturing and securing the end of the wiper spring member in engagement with the plunger.

15. A miniature probe according to claim 14 wherein said stud tapers inwardly as it extends away from the inside end of said plunger, and the end of said wiper spring member is press fitted on said stud.

16. A miniature probe according to claim 14 wherein such inside end of said probe comprises an annular end surface surrounding an end of said stud and which is substantially longitudinally facing, the end of said wiper spring member being press fitted over said stud into engagement with said annular end surface.

17. A miniature probe according to claim 16 wherein the outer perimeter of the end of said wiper spring member is smaller than the outer perimeter of said plunger.

18. A miniature probe according to claim 14 wherein the leg of said wiper spring member extends alongside said plunger.

19. A miniature probe according to claim 14 wherein said plunger comprises a recessed portion inside of said housing, said leg of said wiper spring member extending longitudinally adjacent said recessed portion and comprising end portions inwardly positioned on each side of a bearing surface of said leg, said end portions bearing against the recessed portion and thereby mechanically stabilizing said leg, said leg spring biasing said bearing surface outwardly into low electrical resistance contact with said inside wall.

20. A miniature low resistance spring probe comprising:
   telescoping tubular housing and inner plunger both being elongated and of an electrically conductive material;
   said plunger comprising a probe head external to said housing;
   engaged and concentric inner wall on said housing and outer wall on said plunger providing a sliding electrical connection and a bearing therebetween;
   a coil compression spring urging said housing and plunger in longitudinally opposite directions; and
   means for establishing a substantially constant low resistance electrical connection between said housing and probe during the entire telescoping cycle thereof, comprising
   a separate low electrical resistance wiper spring member affixed to said plunger,
   a substantially constant low resistance electrical connection between said wiper spring member and plunger,
   said wiper spring member comprising an elongated leg extending longitudinally along said plunger and comprising a bearing portion spring loaded by the leg into low electrical resistance contact with said inside wall and an inwardly extending portion on each side of said bearing portion which engages said plunger and stabilizes said leg.

21. A miniature probe according to claim 20 wherein said plunger comprises an annular recessed portion thereon and wherein at least one of the inwardly extending portions of said wiper spring member extends a substantial distance around said plunger in said annular recessed portion.

* * * * *

UNITED STATES PATENT AND TRADEMARK OFFICE
CERTIFICATE OF CORRECTION

PATENT NO. : 4,050,762
DATED : Sept. 27, 1977
INVENTOR(S) : Clyde Kenneth Hines et al It is certified that error appears in the above–identified patent and that said Letters Patent are hereby corrected as shown below:

Column 2, line 14, "engagement" should be -- arrangement --;

Column 8, line 42, "of" should be -- on --.

Signed and Sealed this

Twenty-first Day of February 1978

[SEAL]

Attest:

RUTH C. MASON
Attesting Officer

LUTRELLE F. PARKER
Acting Commissioner of Patents and Trademarks